(12) United States Patent
Kotoku

(10) Patent No.: US 6,493,600 B1
(45) Date of Patent: Dec. 10, 2002

(54) SEMICONDUCTOR MANUFACTURING APPARATUS

(75) Inventor: Kenichi Kotoku, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/241,850

(22) Filed: Feb. 2, 1999

(30) Foreign Application Priority Data

Feb. 5, 1998 (JP) ............................................. 10-039757

(51) Int. Cl.⁷ ............................................... G06F 19/00
(52) U.S. Cl. ..................... 700/121; 700/83; 700/111; 345/700
(58) Field of Search ................................ 700/121, 111, 700/83; 345/700

(56) References Cited

U.S. PATENT DOCUMENTS

| | | | | |
|---|---|---|---|---|
| 5,391,070 A | * | 2/1995 | Ito et al. ...................... | 425/135 |
| 5,822,210 A | * | 10/1998 | Kobayashi et al. ......... | 700/121 |
| 5,933,621 A | * | 8/1999 | Peterson ....................... | 703/23 |
| 6,000,830 A | * | 12/1999 | Asano et al. ................ | 700/121 |
| 6,002,650 A | * | 12/1999 | Kuribayashi et al. ....... | 700/117 |
| 6,025,985 A | * | 2/2000 | Leytes et al. ............... | 361/679 |
| 6,142,660 A | * | 11/2000 | Utsunomiya et al. ....... | 700/121 |

* cited by examiner

*Primary Examiner*—Thomas Black
*Assistant Examiner*—Ronald D Hartman, Jr.
(74) *Attorney, Agent, or Firm*—Fitzpatrick, Cella, Harper & Scinto

(57) ABSTRACT

A semiconductor manufacturing apparatus reduces limitation on operation position due to the layout of a factory, and enables an operator to check data in a working position upon maintenance of the apparatus, thus realizing efficient operation. A console having a display unit to display wafer information, recipe information, apparatus status and the like, and an input unit to input data and information, is removably fixed in any of a plurality of attachment positions provided on the semiconductor manufacturing apparatus main body, via a console attachment member. The height of the display unit and that of the input unit can be adjusted by height adjustment means having band members and fixing members.

14 Claims, 5 Drawing Sheets

SEMICONDUCTOR MANUFACTURING APPARATUS

BACKGROUND OF THE INVENTION

The present invention relates to a semiconductor manufacturing apparatus, and more particularly, to a comparatively large semiconductor manufacturing apparatus installed in a clean room or the like.

Semiconductor manufacturing apparatuses such as a projection exposure apparatus and a coater developer include a console having a display unit which displays an operation status of the apparatus, wafer information on a wafer to be processed, recipe information and the like, and an input unit which inputs data and information necessary for the apparatus. General operation and maintenance work are made by inputting data and information necessary for operation and maintenance with the input unit while checking various data on the display unit.

FIGS. 4 and 5 show structures of the conventional console of the semiconductor manufacturing apparatuses. That is, in the apparatus shown in FIG. 4, a console 110 is integrated with an apparatus main body 101. The console 110 is provided on the front surface of the apparatus main body 101. Reference numeral 120 denotes a power switch panel; 130, a controller rack. In the apparatus shown in FIG. 5, the console 110 is separately provided from the apparatus main body 101. The power switch panel 120 is provided on the apparatus main body 101, however, the console 110 and the controller rack 130 are separately provided from the apparatus main body 101, in appropriate positions adjacent to the apparatus main body 101.

However, in the above conventional arts, in a case where the console is integrated with the apparatus main body as shown in FIG. 4, although the footprint of the entire apparatus can be reduced, operation can be performed only at one portion of the front surface of the apparatus where the console is provided. For this reason, when maintenance work is made on the rear side of the apparatus, to check the result of the work, the apparatus data and the like, the operator must go to the front of the apparatus where the console is provided. Further, in a case where the front area of the apparatus is small due to limitation of the layout of a factory, or there is a track of an unmanned conveyance robot such as an automated guided vehicle (AGV) in front of the apparatus, layout freedom is limited, which disturbs operability of the apparatus.

Further, in the apparatus where the console is separately set from the apparatus main body as shown in FIG. 5, installation freedom for the console can be increased to a certain degree. However, as the console cannot be easily moved, the operator must go to the console to check information, similarly to the former case. Further, the footprint of the apparatus is larger, and the layout is limited due to prolonged connection codes, and further, the connection code may catch the operator's foot.

Further, in the conventional apparatuses as shown in FIGS. 4 and 5, as the height and the inclination of the console cannot be changed, if the apparatus main body is positioned higher or lower than the floor level due to the limitation of installation, the height of the operation surface changes in accordance with the height of the apparatus, which forces the operator to work in an unnatural position.

SUMMARY OF THE INVENTION

The present invention has been made in consideration of the above situation, and has as its object to provide a semiconductor manufacturing apparatus which enables appropriate setting of an attachment position of an operation unit in accordance with the layout of a factory or clean environment, and enables efficient operation and maintenance work.

According to the present invention, the foregoing object is attained by providing a semiconductor manufacturing apparatus comprising: a main body which performs semiconductor manufacturing processing; an operation unit which allows a user to operate the main body; and operation-unit attachment means having a plurality of attachment members to removably attach the operation unit to the main body, in a plurality of positions of the main body.

In accordance with the present invention as described above, by providing a plurality of attachment members for the console of the semiconductor manufacturing apparatus such as a projection exposure apparatus, the console can be attached to an appropriate position in accordance with the layout of the factory or clean environment. This reduces the limitation on operation position in the layout of the factory, and enables a user to quickly check data from the work position upon maintenance of the apparatus main body.

Further, another object of the present invention is to facilitate electrical connection, in connection with positional change of the operation unit, by providing a connection portion in each of the plurality of attachment members provided on the main body to electrically connect the operation unit to the main body.

Further, another object of the present invention is to facilitate attachment of the operation unit to a position more suitable to the layout of the factory by providing a plurality of attachment members on a plurality of different surfaces of the main body.

Further, another object of the present invention is to adjust the height of the operation unit in accordance with the height of the installed apparatus or operability for the operator, so as to realize efficient operation and work such as maintenance.

Further, another object of the present invention is to change the attachment position of the operation unit in each of the plurality of attachment members in a lateral direction, so as to adjust the position of the operation unit in the respective attachment positions.

Further, another object of the present invention is to adjust the elevation angle of the display unit in the operation unit, so as to enable efficient operation and work such as maintenance.

Further, another object of the present invention is to enable general operation or work such as maintenance without moving the operation unit and the operator, by attaching a plurality of operation units to the apparatus main body.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

Figure 1:
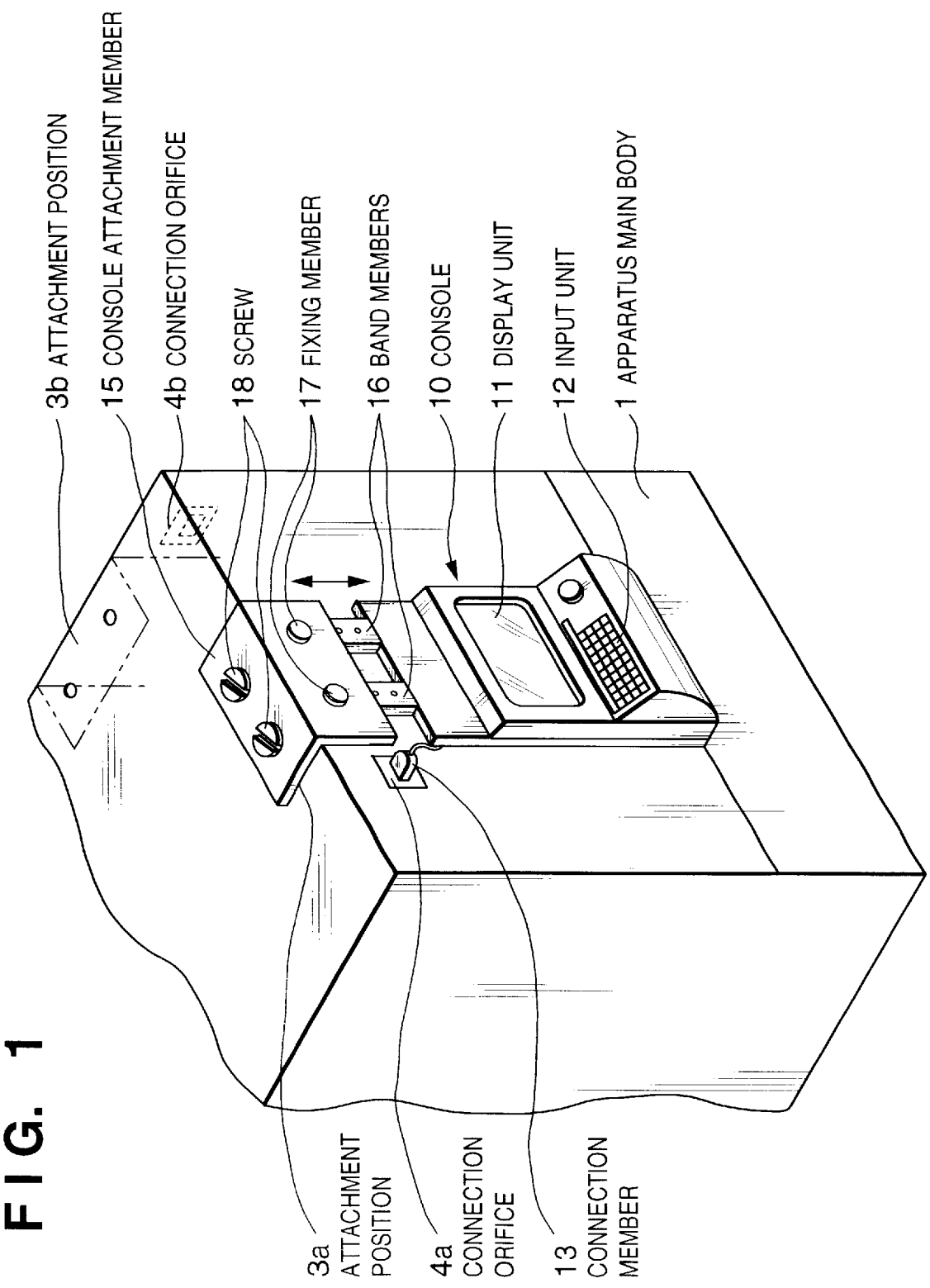
FIG. 1 is a perspective view showing an embodiment of a semiconductor manufacturing apparatus of the present invention.

FIG. 1 is a perspective view showing an embodiment of a semiconductor manufacturing apparatus of the present invention. In FIG. 1, numeral 1 denotes a semiconductor manufacturing apparatus main body (hereinbelow, also referred to as an apparatus main body) such as a projection exposure apparatus; and 10, a console to be attached to the apparatus main body 1. In this figure, the console 10 is provided on the front surface of the apparatus main body 1. The apparatus main body 1 has a plurality of attachment positions 3a, 3b, 3c . . . to attach the console 10 to the apparatus main body 1. (Note that FIG. 1 only shows the attachment positions 3a and 3b. The attachment position 3a is provided on the front surface of the apparatus main body 1, while the attachment position 3b is on the side surface of the apparatus main body 1.) Further, the apparatus main body 1 has a plurality of connection orifices 4a, 4b, 4c, . . . to receive a connection member 13 of the console 10, corresponding to the attachment positions.

The console 10 comprises a display unit 11 to display wafer information and recipe information to process wafers by the semiconductor manufacturing apparatus, the operation status of the apparatus and the like, and an input unit 12 to input data and information necessary for the apparatus main body 1. Further, the console 10 has a console attachment member 15 to attach the console 10 to the apparatus main body 1, a pair of band members 16 as height adjustment means for adjusting the height of the display unit 11 and that of the input unit 12 with respect to the console attachment member 15, and fixing members 17 such as screws to removably fix the band members 16 to the console attachment member 15. Further, the console 10 has a connection member 13 to be connected to the connection orifice 4 (4a, 4b, . . . ) of the apparatus main body 1 for connection of signals and power between the console 10 and the apparatus main body 1.

The console 10 constructed as above is attached to the apparatus main body 1 by setting the console attachment member 15 to an appropriate attachment position 3, e.g., the front attachment position 3a shown in FIG. 1, and removably fixing the attachment member 15 by using the screws 18. Further, the height of the display unit 11 and that of the input unit 12 of the console 10 can be adjusted by adjusting the length of the pair of band members 16 as height adjustment means and then fixing the pair of band members 16 to the console attachment member 15 by using the pair of fixing members 17. Then, the connection member 13 of the console 10 is inserted into the connection orifice 4a corresponding to the attachment position 3a. Thus, general operation and maintenance can be made by inputting data and information necessary for operation and maintenance with the input unit 12 while checking various data on the display unit 11.

Figure 2A:
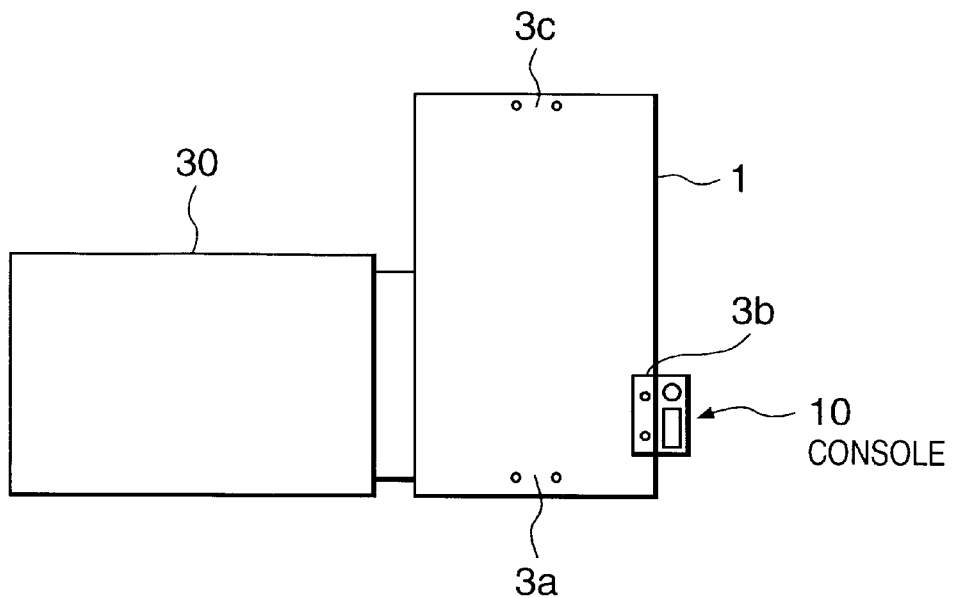
FIG. 2A is a plan view schematically showing a modification of the semiconductor manufacturing apparatus of the present invention.

Recently, with the arrival of automated guided vehicle (AGV) systems, a track of an unmanned conveyance robot is occasionally provided in front of the apparatus. In such a case, if the console is provided in a front position, it is dangerous for an operator, and working efficiency is lowered. In this case, it is preferable that the attachment position of the console is moved to another attachment position. For example, as shown in FIG. 2A, the console 10 can be moved from the front attachment position 3a to the side attachment position 3b. That is, the pair of screws 18 at the console attachment member 15 of the console 10 are removed from the attachment position 3a, and the connection member 13 is removed from the connection orifice 4a. Then, the console 10 is moved to the attachment position 3b on the side surface of the apparatus main body 1, the console attachment member 15 is fixed to the attachment position 3b with the pair of screws 18, and the connection member 13 is connected to the connection orifice 4b. This movement of the console 10 enables operation on the side surface of the apparatus main body 1. Note that in FIG. 2A, numeral 3a denotes the front attachment position of the apparatus main body 1; 3b, the side attachment position of the apparatus main body 1; and 3c, a rear attachment position of the apparatus main body 1. Further, numeral 30 denotes a coater developer.

Figure 2B:
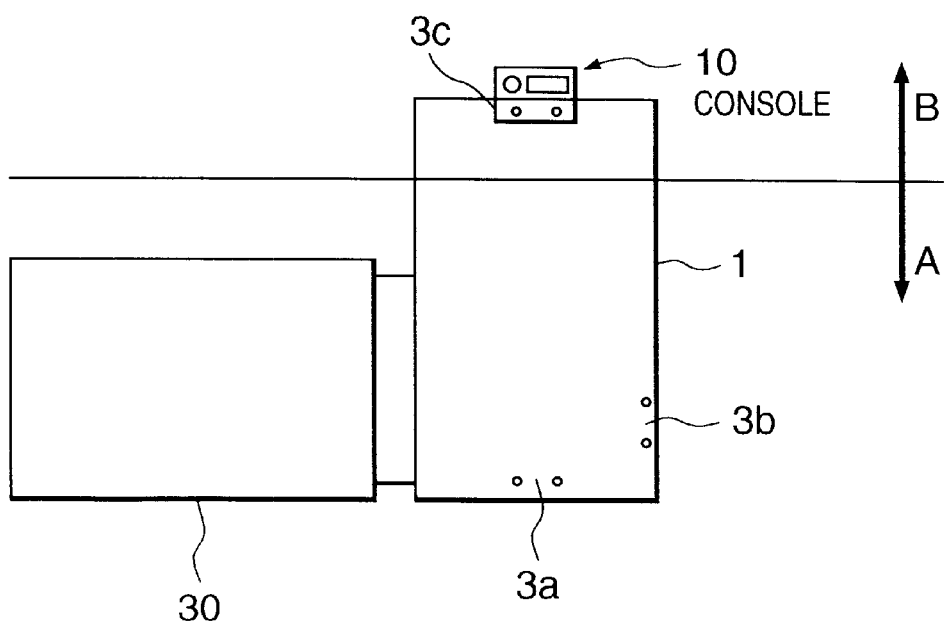
FIG. 2B is a plan view schematically showing the semiconductor manufacturing apparatus of the present invention applied to a clean room having different cleanness.

Further, FIG. 2B shows another embodiment where the semiconductor manufacturing apparatus main body 1 such as a projection exposure apparatus and the coater developer 30 are provided in a clean zone (A). In the clean zone (A), it is necessary to avoid anybody's access as much as possible to maintain cleanness. A gray zone (B) is provided as a place accessible for a person in charge of maintenance or operation. In this environment, the console 10 is preferably provided in the gray zone (B) in the rear of the apparatus. In the present embodiment, the console 10 is attached in the console attachment position 3c on the rear surface of the apparatus within the gay zone (B).

Regarding the height adjustment of the console 10, in the embodiment as shown in FIG. 1, the height of the display unit 11 and that of the input unit 12 can be adjusted by using the pair of band members 16 and the pair of fixing members 17 as described above. For example, when the height of the apparatus main body is changed upon reinforcement of the floor strength of the clean room, the above-described height adjustment means allows manual adjustment of the height of the display unit 11 and that of the input unit 12. Further, the height adjustment means for manual adjustment may be replaced by a motor or control means to automatically adjust the heights.

Further, in the embodiments as shown in FIG. 1 and FIGS. 2A and 2B, one console 10 is moved to the attachment position 3a on the front surface of the apparatus, the attachment position 3b on the side surface of the apparatus or the attachment position 3c on the rear surface of the apparatus, so that the console 10 is attached to an attachment position appropriate for operation and maintenance work. However, it may be arranged such that a plurality of consoles 10 are provided to the respective attachment positions 3a, 3b, 3c, . . . of the apparatus main body 1 in advance. In this manner, by attaching the plurality of consoles 10 to the attachment positions 3a, 3b, 3c, . . . respectively, upon general operation or work such as maintenance, the operator can see displayed data or the like and perform input operation without moving the console and the operator himself/herself. Thus, the operator can perform operation in a plurality of operation positions.

Next, another embodiment of the present invention will be described with reference to FIG. 3.

Figure 3:
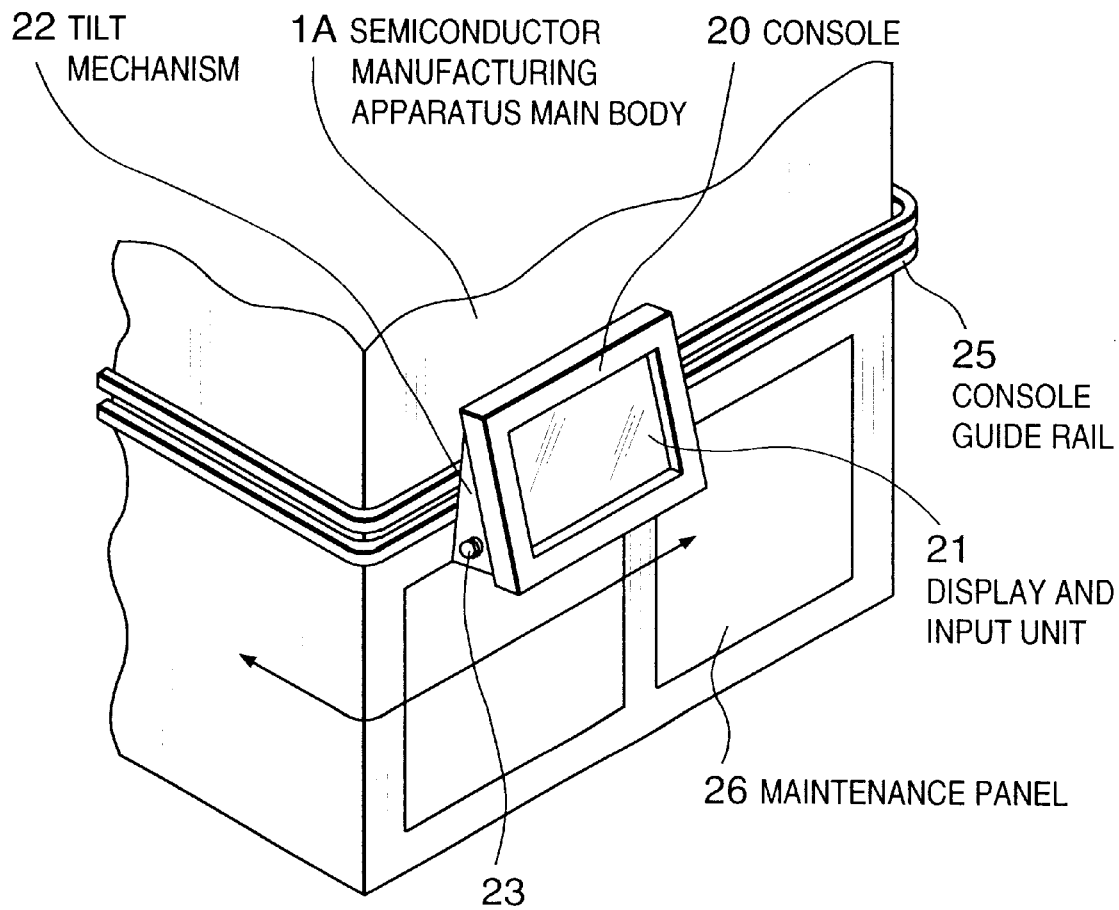
FIG. 3 is a perspective view showing another embodiment of the semiconductor manufacturing apparatus of the present invention.
Figure 4:
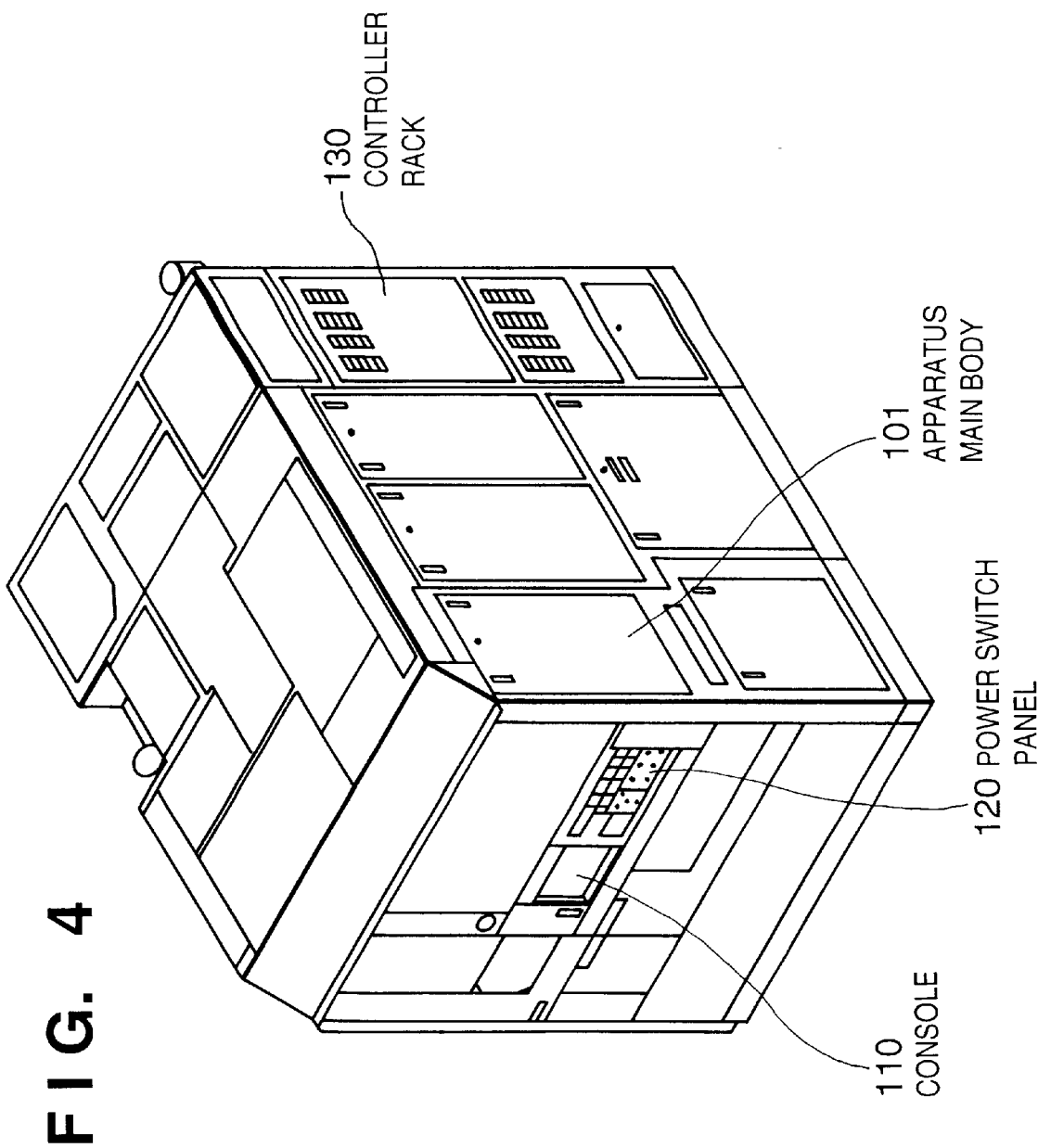
FIG. 4 is a perspective view showing the conventional semiconductor manufacturing apparatus.
Figure 5:
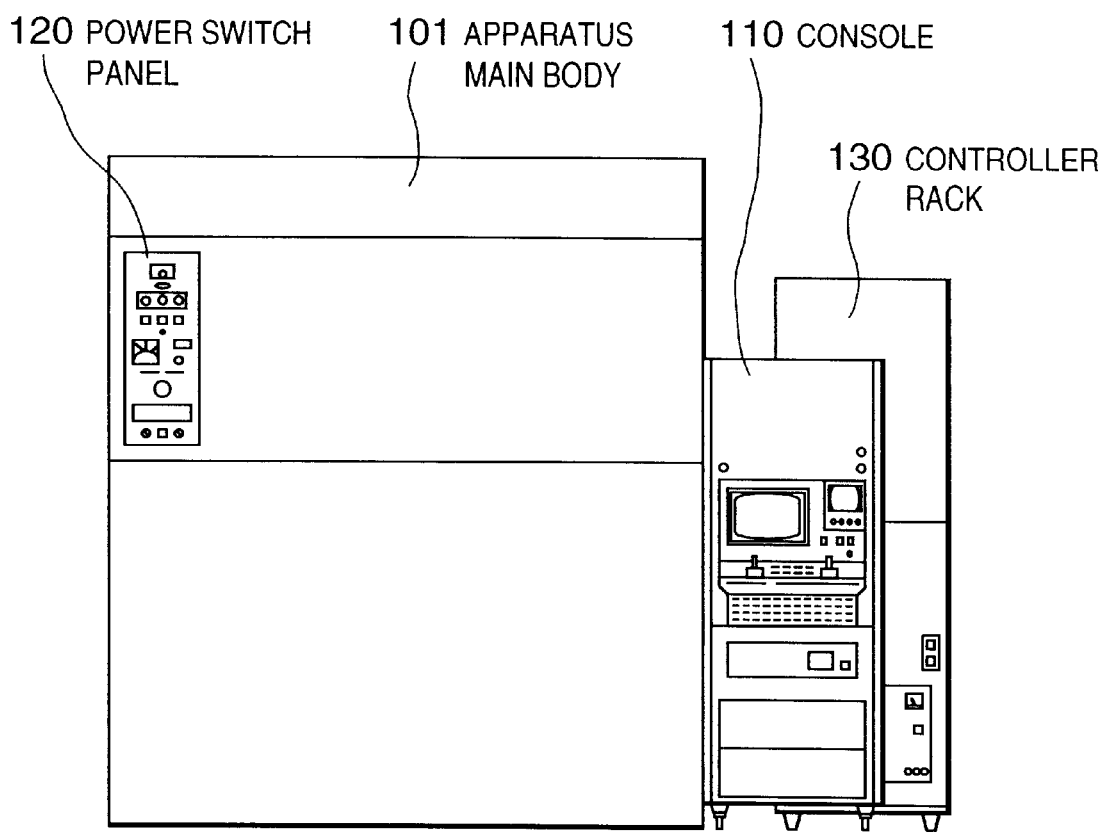
FIG. 5 is an elevation showing the conventional semiconductor manufacturing apparatus.

In FIG. 3, a console guide rail 25 is provided around a semiconductor manufacturing apparatus main body 1A, and a console 20 is attached movably along the console guide rail 25. In this arrangement, the console 20 is moved along the console guide rail 25 in the arrow direction to an appropriate position, then fixed to the position by fixing means (not shown) and used there.

Numeral 21 denotes a display and input unit where a thin display such as an LCD and a plasma display is used as a display unit, and a touch sensor is attached to the surface of the display unit. As the touch sensor, any one of various types of touch sensors such as an electrostatic type sensor and an optical type sensor is employed, and it is arranged such that input is made by touching a switch, ten keys and the like displayed on the display unit.

As this type of display has a narrow view angle, it is preferable to watch the display from a position vertically facing the display as correctly as possible to precisely watch the display. Further, it is preferable to provide a tilt mechanism 22 so as to control the angle of the display to a position where the operator can easily watch the display. In this case, the angle of the display is adjusted by the tilt mechanism 22, and then the display is fixed with a screw 23. Further, the height of the display (display and input unit 21) is adjusted by a height adjustment mechanism (not shown). Note that it is also preferable to set the touch sensor to an appropriate angle where the operator can easily operate, therefore, it is preferable that the tilt of the display can be adjusted from this point. Further, signal transfer between the display and input unit and the apparatus main body is made via a connection cable similarly to the above-described embodiments, or by radio communication such as the IR (Infrared Rays) communication method.

In the above arrangement, operation can be performed in any position around the apparatus main body 1A by moving the console 20 along the console guide rail 25. Further, as the console 20 can be easily moved, the operation position can be freely set. Further, operation and maintenance can be performed in approximately the same position by shifting the console 20 a little so as to remove a maintenance panel 26 and perform maintenance. After the maintenance, the console can be placed in front of the maintenance panel 26 again. This reduces the space of the installed apparatus.

As described above, according to the present invention, as the attachment position of the console of the semiconductor manufacturing apparatus such as a projection exposure apparatus can be selected from a plurality of attachment positions, the console can be attached to a position in accordance with the layout of a factory or clean environment, and the limitation on operation position due to the layout of a factory can be reduced. Further, upon maintenance of the apparatus main body, the operator can see data from the work position. Further, the height and/or the angle of the console can be appropriately selected in accordance with the height of the installed apparatus and operability for the operator.

Further, by attaching a plurality of consoles to the apparatus, the operator can see displayed data and perform an input operation without moving the console and the operator himself/herself upon general operation and work such as maintenance. This allows the operator to operate the apparatus in plural positions.

As many apparently widely different embodiments of the present invention can be made without departing from the spirit and scope thereof, it is to be understood that the invention is not limited to the specific embodiments thereof except as defined in the appended claims.

What is claimed is:

1. A semiconductor manufacturing apparatus comprising:
   a main body which performs semiconductor manufacturing processing;
   an operation unit which allows a user to operate said main body; and
   operation unit attachment means having a plurality of attachment members to removably attach said operation unit to said main body, in a plurality of positions of said main body,
   wherein said plurality of attachment members can respectively change the height of said operation unit.

2. The semiconductor manufacturing apparatus according to claim 1, wherein said operation unit includes:
   display means for displaying a status of said main body, wafer information and recipe information; and
   input means for inputting operation information into said main body.

3. The semiconductor manufacturing apparatus according to claim 2, wherein said display means can change the elevation angle of a display device.

4. The semiconductor manufacturing apparatus according to claim 2, wherein said input means has a touch panel provided on a display screen of said display means.

5. The semiconductor manufacturing apparatus according to claim 1, wherein said plurality of attachment members respectively have connection means for electrically connecting said operation unit to said main body.

6. The semiconductor manufacturing apparatus according to claim 1, wherein said operation-unit attachment means provides said plurality of attachment members on a plurality of different surfaces of said main body.

7. The semiconductor manufacturing apparatus according to claim 1, wherein a plurality of operation units is attached to at least two of said plurality of attachment positions and integrated with the main body.

8. A semiconductor manufacturing apparatus comprising:
   a main body which performs semiconductor manufacturing processing;
   an operation unit which allows a user to operate said main body; and
   a guide provided around said main body,
   wherein said operation unit can be movably attached around said main body.

9. The semiconductor manufacturing apparatus according to claim 8, wherein said operation unit includes:
   display means for displaying a status of said main body, wafer information and recipe information; and
   input means for inputting operation information into said main body.

10. The semiconductor manufacturing apparatus according to claim 9, wherein said display means can change the elevation angle of a display device.

11. The semiconductor manufacturing apparatus according to claim 9, wherein said input means has a touch panel provided on a display screen of said display means.

12. The semiconductor manufacturing apparatus according to claim 8, wherein said plurality of attachment members respectively have connection means for electronically connecting said operation unit to said main body.

13. The semiconductor manufacturing apparatus according to claim 8, wherein said operation-unit attachment means provides said plurality of attachment members on a plurality of different surfaces of said main body.

14. The semiconductor manufacturing apparatus according to claim 8, wherein a plurality of operation units is attached to at least two of said plurality of attachment positions and integrated with the main body.

* * * * *